United States Patent
Yoneyama et al.

(10) Patent No.: US 9,406,624 B2
(45) Date of Patent: Aug. 2, 2016

(54) SEMICONDUCTOR MODULE AND POWER CONVERTER

(71) Applicant: Mitsubishi Electric Corporation, Tokyo (JP)

(72) Inventors: Rei Yoneyama, Tokyo (JP); Akira Goto, Fukuoka (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/825,922

(22) Filed: Aug. 13, 2015

(65) Prior Publication Data

US 2016/0155706 A1    Jun. 2, 2016

(30) Foreign Application Priority Data

Nov. 28, 2014  (JP) ................................. 2014-241915

(51) Int. Cl.
*H01L 23/552* (2006.01)
*H01L 23/31* (2006.01)

(52) U.S. Cl.
CPC .......... *H01L 23/552* (2013.01); *H01L 23/3114* (2013.01)

(58) Field of Classification Search
CPC ....... H01L 43/02; H01L 43/04; H01L 43/065; H01L 23/552; H01L 43/12
USPC ......................................... 257/421, 425, 728
See application file for complete search history.

(56) References Cited

U.S. PATENT DOCUMENTS

| | | | | |
|---|---|---|---|---|
| 4,893,078 A * | 1/1990 | Auchterlonie | ........... | G01B 7/14 318/660 |
| 5,312,674 A * | 5/1994 | Haertling | .............. | H01L 23/055 252/62 |
| 5,656,857 A | 8/1997 | Kishita | | |
| 2006/0284211 A1 | 12/2006 | Takubo | | |
| 2011/0285312 A1* | 11/2011 | Choutov | ............ | H05B 33/0815 315/291 |
| 2012/0218716 A1* | 8/2012 | Asakura | .............. | H01L 23/4006 361/717 |
| 2015/0069545 A1* | 3/2015 | Noma | ................... | H01L 23/552 257/421 |

FOREIGN PATENT DOCUMENTS

| | | |
|---|---|---|
| JP | S63-255945 A | 10/1988 |
| JP | H07-307416 A | 11/1995 |
| JP | 2004-172176 A | 6/2004 |
| JP | 2006-351986 A | 12/2006 |
| JP | 2011-151372 A | 8/2011 |
| JP | 2012-004237 A | 1/2012 |

* cited by examiner

*Primary Examiner* — Selim Ahmed
(74) *Attorney, Agent, or Firm* — Studebaker & Brackett PC

(57) ABSTRACT

A semiconductor module includes a case, a semiconductor component provided in the case for switching a current, encapsulating resin provided in the case for covering the semiconductor component, a magnetic shield contacting the encapsulating resin and containing a magnetic material, and an embedded magnetic shield embedded in the case, the embedded magnetic shield containing a magnetic material.

14 Claims, 4 Drawing Sheets

Comparative Example

US 9,406,624 B2

SEMICONDUCTOR MODULE AND POWER CONVERTER

BACKGROUND OF THE INVENTION

1. Field of the Invention

The present invention relates to a semiconductor module to be used for switching, for example, a large current, and a power converter including the semiconductor module.

2. Background Art

Japanese Patent Laid-Open No. H7-307416 discloses a semiconductor device in which conductive resin is provided on insulating resin covering a semiconductor component.

When the semiconductor component performs switching, a magnetic field is generated around the semiconductor component. This magnetic field have adverse effects on operations of devices around the semiconductor component, and therefore should be shielded. However, there has been a problem that the technique disclosed in Patent Document 1 cannot sufficiently shield the magnetic field.

SUMMARY OF THE INVENTION

The present invention has been made to solve the above-described problem, and an object of the present invention is to provide a semiconductor module which provides sufficient shielding of a magnetic field generated in a semiconductor component, and a power converter including the semiconductor module.

The features and advantages of the present invention may be summarized as follows.

According to one aspect of the present invention, a semiconductor module includes a case, a semiconductor component provided in the case for switching a current, encapsulating resin provided in the case for covering the semiconductor component, a magnetic shield contacting the encapsulating resin and containing a magnetic material, and an embedded magnetic shield embedded in the case, the embedded magnetic shield containing a magnetic material.

According to another aspect of the present invention, a semiconductor module includes a case, a semiconductor component provided in the case for switching a current, encapsulating resin provided in the case for covering the semiconductor component, a magnetic shield contacting the encapsulating resin and containing a magnetic material, a control circuit board provided above the magnetic shield in the case, and an electronic component fixed to the control circuit board.

According to another aspect of the present invention, a power converter includes a semiconductor module having a case, a semiconductor component provided in the case for switching a current, encapsulating resin provided in the case for covering the semiconductor component, a magnetic shield contacting the encapsulating resin and containing a magnetic material, and an embedded magnetic shield embedded in the case, the embedded magnetic shield containing a magnetic material, and a control circuit provided outside the semiconductor module for transmitting a control signal to the semiconductor component.

Other and further objects, features and advantages of the invention will appear more fully from the following description.

DETAILED DESCRIPTION OF THE PREFERRED EMBODIMENTS

Semiconductor modules and power converters according to embodiments of the present invention will be described with reference to the drawings. The same or corresponding components will be denoted by the same reference signs, and the repetition of explanation thereof may be avoided.

First Embodiment

Figure 1:
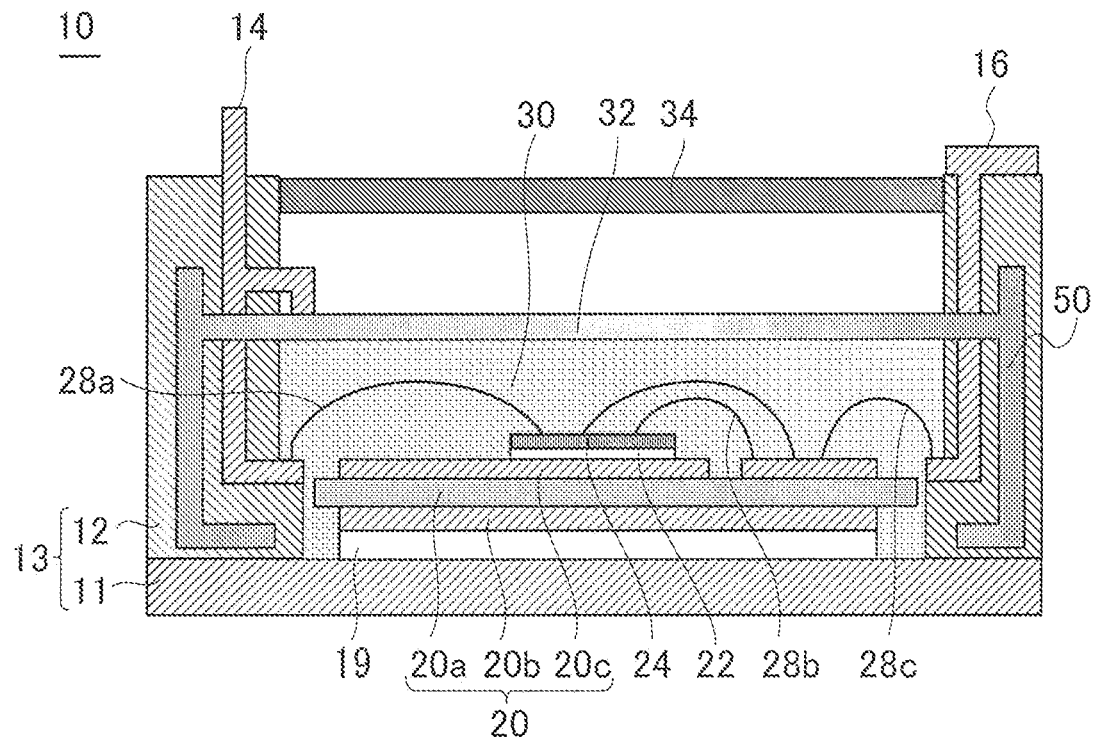
FIG. 1 is a cross-sectional view of a semiconductor module according to first embodiment.

FIG. 1 is a cross-sectional view of a semiconductor module 10 according to first embodiment of the present invention. The semiconductor module 10 includes a case 13 including a base plate 11 and a wall portion 12. A signal terminal 14 and a power terminal 16 are embedded in the case 13. The signal terminal 14 includes a portion exposed to the inside of the case 13 and a portion exposed to the outside of the case 13. The power terminal 16 is configured similarly.

An insulating board 20 is fixed to the base plate 11 with solder 19. The insulating board 20 includes a ceramic substrate 20a, a metal layer 20b formed on a lower surface of the ceramic substrate 20a, and a metal pattern 20c formed on an upper surface of the ceramic substrate 20a.

A semiconductor component 24 is fixed to the metal pattern 20c with solder 22. The semiconductor component 24 is a component which switches a current, such as an IGBT (Insulated Gate Bipolar Transistor). In addition to the semiconductor component 24, a free wheel diode or the like may be mounted. A wire 28a connects a gate of the semiconductor component 24 and the signal terminal 14. A wire 28b connects an emitter of the semiconductor component 24 and the metal pattern 20c. A wire 28c connects the metal pattern 20c connected to the emitter and the power terminal 16. It should be noted that a collector formed on a back side of the semiconductor component 24 is connected to an unillustrated power terminal through the metal pattern 20c immediately under the semiconductor component 24.

In this way, the insulating board 20, the semiconductor component 24, and the wires 28a, 28b, and 28c are housed in the case 13. Encapsulating resin 30 covering the semiconductor component 24 is provided in the case 13. A magnetic shield 32 is formed on the encapsulating resin 30 to contact the encapsulating resin 30. The magnetic shield 32 is formed on the whole of an upper surface of encapsulating resin 30. The magnetic shield 32 contains a magnetic material. The magnetic shield 32 is preferably made of resin containing a magnetic material. Such resins include, for example, epoxy resin containing ferrite powder.

An embedded magnetic shield 50 is embedded in the case 13. The embedded magnetic shield 50 is formed to surround side surfaces of the semiconductor component 24. The embedded magnetic shield 50 surrounds the semiconductor component 24 in an unbroken manner in planar view. The embedded magnetic shield 50 contains a magnetic material. It should be noted that the embedded magnetic shield 50 and the magnetic shield 32 are made of the same material and preferably formed at the same time.

A lid 34 is provided above the magnetic shield 32. The semiconductor component 24 is turned on or off in accordance with a signal from the signal terminal 14, and a principal current thereof flows into the power terminal 16. When EMI radiation noise of the semiconductor component 24 is large, a magnetic field thereof causes surrounding devices to malfunction. For example, in the case where a current of several amperes to hundreds of amperes is handled, EMI radiation noise is also large. Accordingly, a magnetic field generated in association with the switching of the semiconductor component 24 should be prevented from leaking out of the semiconductor module 10.

In the semiconductor module 10 according to first embodiment of the present invention, the magnetic shield 32 and the embedded magnetic shield 50 can prevent a magnetic field generated in the semiconductor component 24 from leaking out. Specifically, the magnetic shield 32 provides shielding of a magnetic field generated above the semiconductor component 24, and the embedded magnetic shield 50 provides shielding of a magnetic field generated beside the semiconductor component 24.

In the case where the magnetic shield 32 and the embedded magnetic shield 50 are made of resin containing a magnetic material, the magnetic shield 32 and the embedded magnetic shield 50 can be easily formed only by pouring the resin on the encapsulating resin 30. Accordingly, no structure is required to fix the magnetic shield 32 and the embedded magnetic shield 50 in place. Moreover, in the case where the magnetic shield 32 having a certain degree of mobility is used, pouring this on the encapsulating resin 30 allows the magnetic shield 32 to contact the whole of the upper surface of the encapsulating resin 30 and inner walls of the case 13. In other words, the area of the magnetic shield 32 can be made sufficiently large. It should be noted that the magnetic shield 32 and the embedded magnetic shield 50 may contain thermosetting resin to be hardened by heating.

The semiconductor module 10 is configured such that the magnetic shield 32 and the embedded magnetic shield 50 provides shielding of a magnetic field around the semiconductor component 24. Accordingly, various modifications can be made without losing this feature. For example, the magnetic shield 32 and the embedded magnetic shield 50 are not particularly limited as long as the magnetic shield 32 and the embedded magnetic shield 50 contain a magnetic material. The magnetic shield 32 and the embedded magnetic shield 50 may be any one of liquid, gel, rubber, and elastomer. Moreover, a plate-shaped magnetic shield in a solid state may be fixed to the encapsulating resin 30.

Methods of forming the magnetic shield 32 and the embedded magnetic shield 50 are not particularly limited. For example, the magnetic shield 32 may be applied or dispersed onto the encapsulating resin 30.

The structure of the case 13, a configuration for electrical connection, a configuration for electrical insulation, and the like of the semiconductor module 10 may be appropriately changed. The semiconductor component 24 is often made of Si, but may be made of a wide-bandgap semiconductor. In a high-speed switching semiconductor module or the like, a wide-bandgap semiconductor having a lower loss and higher elevated temperature capability than silicon is preferably used. Wide-bandgap semiconductors include, for example, silicon carbide, gallium nitride materials, and diamond.

The use of a wide-bandgap semiconductor makes it possible to reduce the size of the semiconductor module. Further, the magnetic shield 32 and the embedded magnetic shield 50 are not factors increasing the scale of the semiconductor module. Accordingly, the semiconductor module 10 is favorable for size reduction by the use of a wide-bandgap semiconductor.

The magnetic shield 32 may be blown onto the encapsulating resin 30 by spraying. Moreover, in addition to the magnetic shield 32, conductive resin may be formed on or under the magnetic shield 32 to produce the effect of blocking an electric field. In that case, the effect of shielding an electric field can be improved by providing embedded conductive resin in the case 13.

Figure 2:
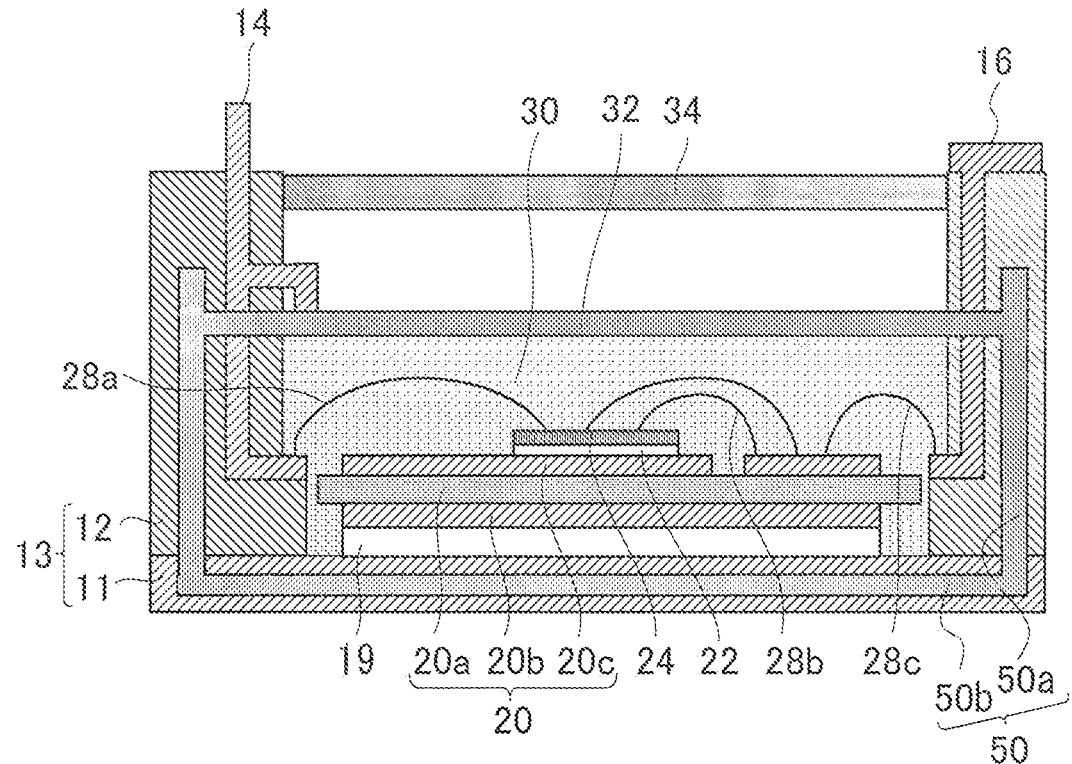
FIG. 2 is a cross-sectional view of a semiconductor module according to a modified example.

FIG. 2 is a cross-sectional view of a semiconductor module according to a modified example. The embedded magnetic shield 50 includes a first portion 50a surrounding side surfaces of the semiconductor component 24 and a second portion 50b provided on a lower surface side of the semiconductor component 24. Since the semiconductor component 24 can be covered with the magnetic shield 32, the first portion 50a, and the second portion 50b, a magnetic field can be shielded in all directions.

These modifications can also be applied to semiconductor modules according to embodiments below. It should be noted that the semiconductor modules according to the embodiments below have many things in common with first embodiment, and therefore differences with first embodiment will be mainly described.

Second Embodiment

Figure 3:
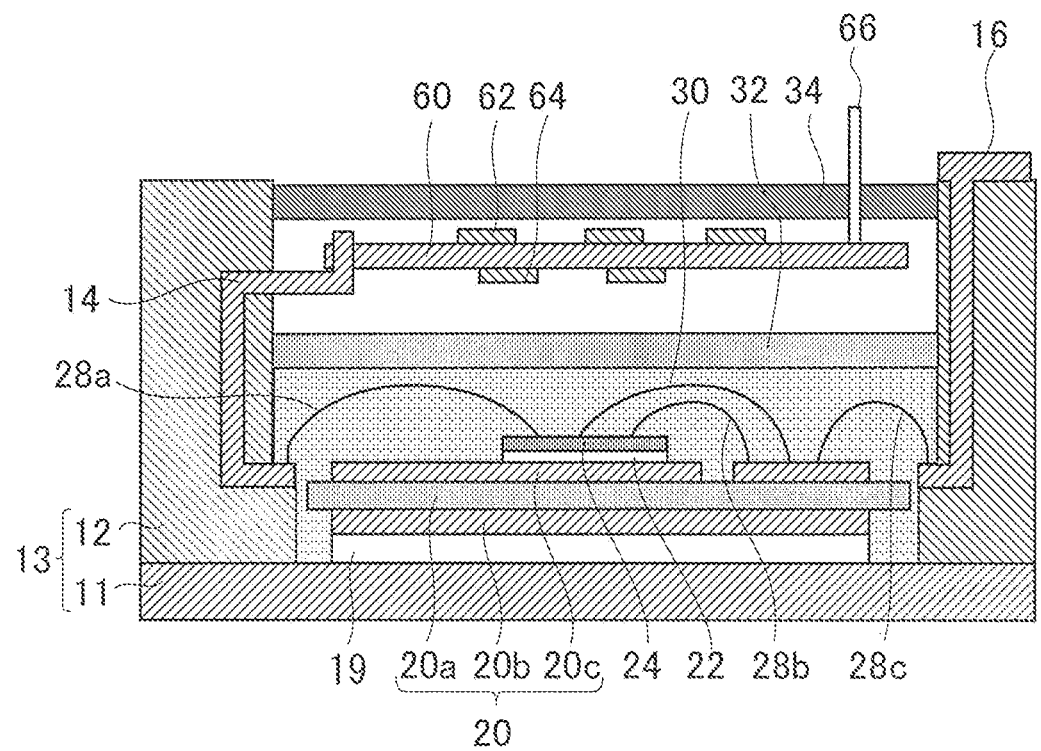
FIG. 3 is a cross-sectional view of a semiconductor module according to second embodiment.

FIG. 3 is a cross-sectional view of a semiconductor module according to second embodiment. A control circuit board 60 is provided above the magnetic shield 32 in the case 13. The control circuit board 60 is, for example, a printed circuit board. Electronic components 62 and 64 are fixed to an upper surface and a lower surface of the control circuit board 60, respectively. A terminal 66 extending to the outside of the semiconductor module is fixed to the control circuit board 60. A control signal transmitted from the terminal 66 to the control circuit board 60 is subjected to a predetermined process in the electronic components 62 and 64 to reach the semiconductor component 24 through the signal terminal 14 and the wire 28a.

Figure 4:
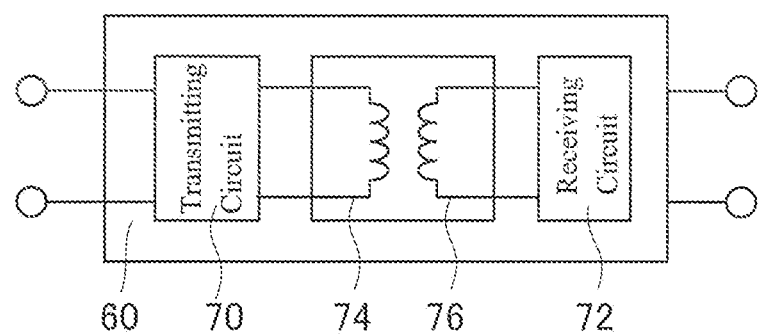
FIG. 4 is a view showing part of a circuit formed by electronic components.

FIG. 4 is a view showing part of a circuit formed by electronic components fixed to the control circuit board 60. FIG. 4 shows a micro transformer structure. A micro transformer structure is configured such that two insulated coils 74 and 76 give and receive magnetic fields to/from each other, whereby a transmitting circuit 70 and a receiving circuit 72 give and receive signals to/from each other. Accordingly, a micro transformer structure malfunctions when externally affected by a magnetic field.

In the case where the semiconductor component 24 and the control circuit board 60 exist in the case 13, the two are located close to each other, and therefore a circuit (structure) formed on the control circuit board 60 may be affected by a strong magnetic field. However, in the semiconductor module according to second embodiment of the present invention, since the magnetic shield 32 exists between the semiconductor component 24 constituting a source of a magnetic field and the control circuit board 60, a malfunction of the micro transformer structure can be prevented. It should be noted that a circuit which performs communications by giving and receiving magnetic fields, other than a micro transformer, may be formed on the control circuit board 60.

Third Embodiment

Figure 5:
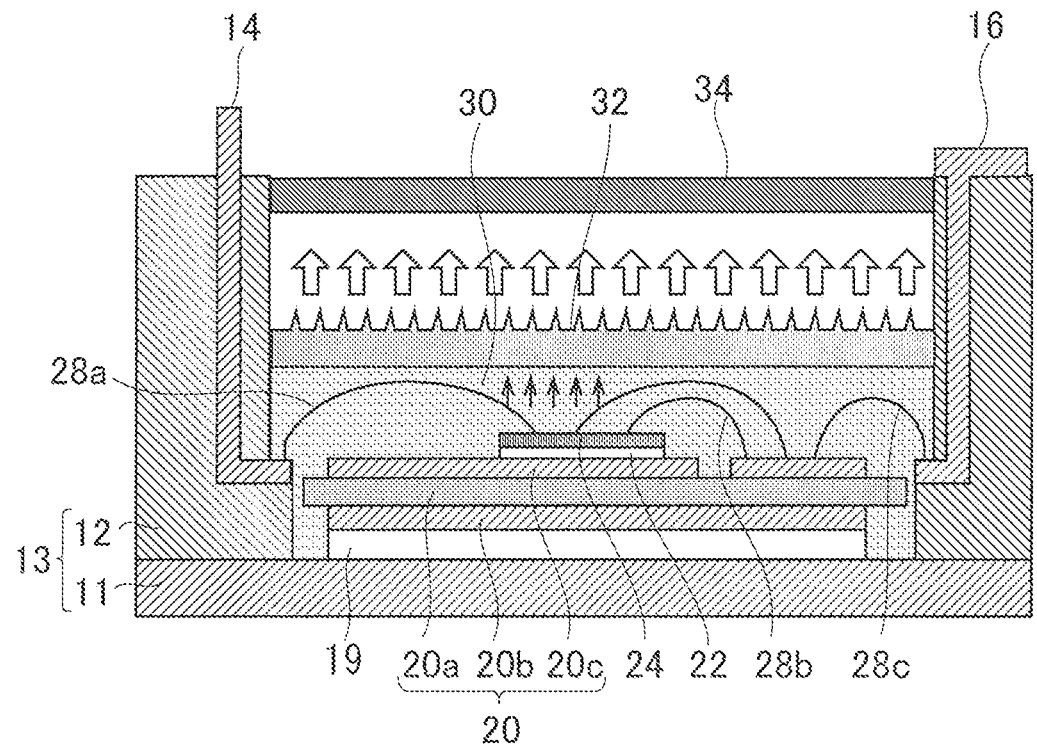
FIG. 5 is a cross-sectional view of a semiconductor module according to third embodiment.

FIG. 5 is a cross-sectional view of a semiconductor module according to third embodiment. A material having a higher thermal conductivity than the encapsulating resin 30 is mixed in the magnetic shield 32. This makes the thermal conductivity of the magnetic shield 32 higher than the thermal conductivity of the encapsulating resin 30. For example, since the thermal conductivity of the encapsulating resin 30 made of epoxy resin is 0.21 [W☐m−1☐K−1], a material having a thermal conductivity higher than the thermal conductivity thereof is mixed in the magnetic shield 32. In the case where a magnetic material contained in the magnetic shield 32 is ferrite powder, the ferrite powder often corresponds to the "material having a higher thermal conductivity than the encapsulating resin." To sufficiently increase the thermal conductivity of the magnetic shield 32, a material having a very high thermal conductivity, such as gold, silver, or copper, is preferably mixed in the magnetic shield 32.

The surface roughness of an upper surface of the magnetic shield 32 is larger than the surface roughness of the upper surface of the encapsulating resin 30. Thus, the area of the upper surface of the magnetic shield 32 is larger than the area of the upper surface of the encapsulating resin 30.

In a general semiconductor module, heat generated in a semiconductor component is radiated to a region under the semiconductor component through a base plate. In the semiconductor module according to third embodiment of the present invention, the material and the shape of the magnetic shield 32 are specified so as to facilitate heat dissipation as described above. Accordingly, heat can be radiated to a region above the semiconductor component 24 through the magnetic shield 32. Thus, in the semiconductor module according to third embodiment of the present invention, heat can be radiated to both of regions above and under the semiconductor component 24, and therefore sufficient heat dissipation performance can be obtained. It should be noted that sufficient heat dissipation performance allows a reduction in the size of the semiconductor component 24 itself and a reduction in the size of the semiconductor module.

Fourth Embodiment

Figure 6:
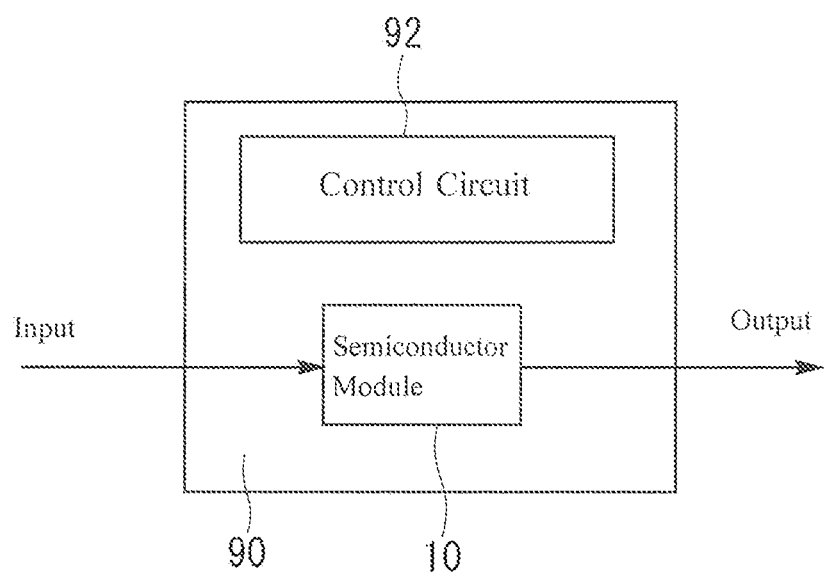
FIG. 6 is a conceptual diagram of a power converter according to fourth embodiment.

FIG. 6 is a conceptual diagram of a power converter according to fourth embodiment of the present invention. This power converter includes a casing 90. The semiconductor module 10 described in first embodiment is provided in the casing 90. The semiconductor module 10 may be replaced by the semiconductor module of second or third embodiment. A control circuit 92 which transmits a control signal to the semiconductor component is provided in the casing 90. The control circuit 92 is provided outside the semiconductor module 10.

The power converter is not particularly limited as long as the power converter switches a large current. Examples of the power converter include an inverter circuit, a converter circuit, a servo amplifier, and a power supply unit. The output from the power converter may be of any type such as single-phase, three-phase, direct-current, alternating-current, or the like.

Figure 7:
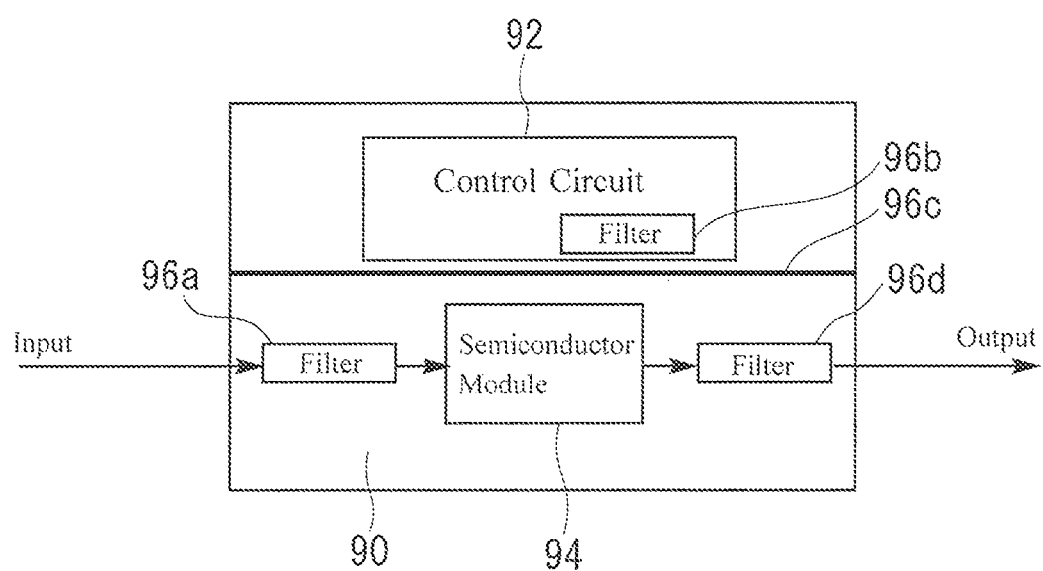
FIG. 7 is a conceptual diagram of a power converter according to a comparative example.

FIG. 7 is a conceptual diagram of a power converter according to a comparative example. The power converter of the comparative example includes a casing 90 and further includes a semiconductor module 94 and the control circuit 92 provided in the casing 90. The semiconductor module 94 has no magnetic shield. To reduce the influence of a magnetic field which is exerted from the semiconductor module 94 to the control circuit 92, noise filters 96a, 96b, 96c, and 96d are provided.

In the power converter according to fourth embodiment of the present invention, since the magnetic shield of the semiconductor module 10 provides shielding of a magnetic field generated in the semiconductor component, a noise filter can be omitted to simplify the power converter. Further, since the volume of the semiconductor module does not increase due to the provision of the magnetic shield, the size of the power converter can be easily reduced. It should be noted that features of the semiconductor module and the power converters according to the embodiments described above may be appropriately combined.

The present invention includes a magnetic shield contacting encapsulating resin and an embedded magnetic shield embedded in a case to provide sufficient shielding of a magnetic field.

Obviously many modifications and variations of the present invention are possible in the light of the above teachings. It is therefore to be understood that within the scope of the appended claims the invention may be practiced otherwise than as specifically described.

What is claimed is:

1. A semiconductor module comprising:
a case;
a semiconductor component provided in the case for switching a current;
encapsulating resin provided in the case for covering the semiconductor component;
a magnetic shield contacting the encapsulating resin and containing a magnetic material; and
an embedded magnetic shield embedded in the case so as to be surrounded by the case on all sides, the embedded magnetic shield containing a magnetic material.

2. The semiconductor module according to claim 1, wherein the magnetic shield is formed on whole of an upper surface of the encapsulating resin.

3. The semiconductor module according to claim 1, wherein the embedded magnetic shield surrounds side surfaces of the semiconductor component.

4. The semiconductor module according to claim 1, wherein the embedded magnetic shield is provided on a lower surface side of the semiconductor component.

5. The semiconductor module according to claim 1, further comprising:
a control circuit board provided above the magnetic shield in the case; and
an electronic component fixed to the control circuit board.

6. A semiconductor module comprising:
a case;
a high-power semiconductor component provided in the case for switching a current;
encapsulating resin provided in the case for covering the semiconductor component;
a magnetic shield contacting the encapsulating resin and containing a magnetic material;
a control circuit board provided above the magnetic shield in the case; and
an electronic component fixed to the control circuit board.

7. The semiconductor module according to claim 6, wherein the electronic component comprises a micro transformer for performing communications by giving and receiving magnetic fields.

8. The semiconductor module according to claim 1, wherein
a thermal conductivity of the magnetic shield is higher than a thermal conductivity of the encapsulating resin, and
surface roughness of an upper surface of the magnetic shield is larger than surface roughness of an upper surface of the encapsulating resin.

9. The semiconductor module according to claim 1, wherein the magnetic shield is resin containing a magnetic material.

10. The semiconductor module according to claim 9, wherein the magnetic shield is epoxy resin containing ferrite powder.

11. The semiconductor module according to claim 1, wherein the magnetic shield is any one of liquid, gel, rubber, and elastomer.

12. The semiconductor module according to claim 1, wherein the semiconductor component is made of a wide-bandgap semiconductor.

13. The semiconductor module according to claim 12, wherein the wide-bandgap semiconductor is any one of silicon carbide, gallium nitride materials, and diamond.

14. A power converter comprising:
a semiconductor module comprising:
a case;
a semiconductor component provided in the case for switching a current;
encapsulating resin provided in the case for covering the semiconductor component;
a magnetic shield contacting the encapsulating resin and containing a magnetic material; and
an embedded magnetic shield embedded in the case so as to be surrounded by the case on all sides, the embedded magnetic shield containing a magnetic material; and
a control circuit provided outside the semiconductor module for transmitting a control signal to the semiconductor component.

* * * * *